United States Patent [19]
Lochhead

[11] Patent Number: 5,451,956
[45] Date of Patent: Sep. 19, 1995

[54] INSTANTANEOUS PARAMETER MEASURING RECVEIVER

[75] Inventor: Donald L. Lochhead, San Diego, Calif.

[73] Assignee: TRW Inc., Redondo Beach, Calif.

[21] Appl. No.: 109,804

[22] Filed: Aug. 20, 1993

[51] Int. Cl.[6] .......................... G01S 7/40; G01R 23/02
[52] U.S. Cl. ...................... 342/13; 342/192; 324/76.38
[58] Field of Search ................ 342/13, 192; 324/76.38

[56] References Cited

U.S. PATENT DOCUMENTS

| | | | |
|---|---|---|---|
| 3,665,512 | 5/1972 | Hall et al. | 342/13 |
| 3,714,654 | 1/1973 | Wicks et al. | 342/13 |
| 4,146,892 | 3/1979 | Overman et al. | 342/192 X |
| 4,303,921 | 12/1981 | Fitzgerald | 342/13 |
| 4,336,541 | 6/1982 | Tsui et al. | 342/13 |
| 4,600,925 | 7/1986 | Alitz et al. | 342/192 |
| 4,651,332 | 3/1987 | Brown | 342/13 X |
| 4,928,105 | 5/1990 | Langner | 342/192 |

Primary Examiner—Gilberto Barrón, Jr.
Attorney, Agent, or Firm—Gregory G. Schivley; Robert W. Keller; Sol L. Goldstein

[57] ABSTRACT

A method and apparatus for processing the log video output of a receiver that can measure multiple time overlapped pulses on a nearly instantaneous basis. The receiver measures frequency, pulse modulation, time of arrival, amplitude, pulse width and phase difference when simultaneous pulses are present. To detect pulse parameters a given voltage threshold must be exceeded and M out of the last N data samples must fall within a given voltage window that is above the threshold voltage. Pulse detection is initiated by establishing a dynamic noise threshold that is above the random noise level. When a pulse arrives, the value of the amplitude samples are measured and when the successive differences between the amplitude samples are small enough then a pulse presence is declared. Following detection of a pulse, amplitude samples are continuously taken and processed to detect the end of the pulse or a pulse-on-pulse condition. A pulse-on-pulse condition is detected when the difference between successive amplitude samples again starts to increase after initially stabilizing. As soon as M out of the last N amplitude samples fall within a predetermined voltage window then the second pulse has stabilized. On the trailing edge of the second pulse, the successive differences between amplitude samples become comparatively large and fall outside of the predetermined amplitude window indicating termination of the second pulse. By using this method, the receiver can determine when the leading edge of a pulse occurs, when the pulse is stable, when an additional pulse is encountered and when the pulse terminates.

15 Claims, 3 Drawing Sheets

| CONDITION | WAVEFORM | DESIGNATION | VALID | DEGRADED |
|---|---|---|---|---|
| 1 | >150nS >150nS >150nS  dB | FIRST PULSE | * FREQ.  * PW  * TOA  * AMP | |
| | | SECOND PULSE | * FREQ.  * PW  * TOA  * AMP | |
| 2 | >150nS >150nS  dB | FIRST PULSE | * FREQ.  * AMP  * TOA | * PW |
| | | SECOND PULSE | * FREQ.  * PW  * TOA  * AMP | |
| 3 | >150nS >150nS  dB | FIRST PULSE | * FREQ.  * PW  * TOA  * AMP | |
| | | SECOND PULSE | * FREQ.  * AMP | * PW  * TOA |

INSTANTANEOUS PARAMETER MEASURING RECVEIVER

FIELD OF THE INVENTION

This invention relates to an RF receiver capable of instantaneously measuring the characteristics of signal pulses that are simultaneously received from two or more separate RF emission sources.

BACKGROUND OF THE INVENTION

Modern military aircraft employ electronic warfare systems as part of their offensive and defensive capabilities. Many of those systems emit RF signals which are an invisible form of energy that travels through space. Radar systems use RF emissions to locate and track opposing aircraft and some radar systems are incorporated within missiles to assist in the self-guided propulsion of a missile to its target. From a defensive aspect, an electronic warfare search receiver is used to detect those RF emissions. The receiver searches the range of frequencies in which those RF emissions are likely to occur (the RF spectrum) to detect and analyze the nature of the RF signals. By determining the characteristics of the signals received by this equipment, the defender will know the nature of the threat and, for example, will know if a radar guided missile has "locked on" to the defenders aircraft. These systems are used in friendly as well as in unfriendly aircraft. In a tactical or strategic environment, the number of aircraft and, hence, the density and diversity of the emissions in the RF spectrum is quite large and is expected to increase. Existing detection and monitoring equipment that use wide band search receivers will find the RF emissions difficult or impossible to successfully monitor in such an environment. For example, some existing wide band receiver designs employ a threshold detector that requires the incoming signal to attain a certain amplitude before it is recognized as a true signal apart from the ordinary RF background noise. These receivers are incapable of detecting two different RF pulses that occur simultaneously. With the existing design, it is entirely possible that the first RF pulse received will effectively prevent detection of a second RF pulse, from another emitter, occurring during the presence of the first pulse. The first emission source may be identified, but the second source is in effect masked. In a tactical environment, the failure to detect the existence of a second emission source is a disadvantage.

In traditional Electronic Warfare/Electronic Support Measures (EW/ESM) receivers, techniques are used in which the receiver's video output is digitized. Digitization occurs when the amplitude of the input signal exceeds a predetermined threshold level. After the threshold has been crossed, the signal parameters for that signal are digitized. However, if a second signal occurs before the first signal drops below the threshold, then the second signal will not be detected. This allows a continuous wave or long pulse width signal to prevent detection of subsequent signals occurring simultaneously with tile first signal, even if the subsequent signals are significantly larger in amplitude than the first signal.

It is unlikely that a single receiver type will be capable of meeting all offensive or defensive threat detection and analysis requirements dictated by the future electronic warfare environment. Instead, a set of search and analysis receivers with complementary capabilities are likely to be required to meet future demands. Trade-offs between probability of intercept, bandwidth, simultaneous signal resolution, sensitivity and receiver complexity are necessary. Simultaneous signal resolution is an important requirement that needs to be addressed in order to reduce the risk that an enemy radar signal will go undetected. Various techniques have been proposed to detect simultaneous signal conditions and suppress invalid data. One such system uses a dispersive delay line to separate signals, such as shown in U.S. Pat. No. 3,939,411. With this background it is desirable to provide a wide band receiver that has a high probability of detecting simultaneous signals and that can also measure in real time the phase, frequency, time of arrival, pulse modulation, pulse width and amplitude of each signal.

SUMMARY OF THE INVENTION

The invention is a method and apparatus for processing the log video output of a receiver. The system is capable of measuring the signal parameters of RF pulses, including multiple time overlapped pulses on a nearly instantaneous basis. The receiver includes detection elements having a large instantaneous bandwidth coupled with a digital processor that processes separate signals and which measures signal parameters including frequency, pulse modulation, time of arrival, amplitude, pulse width and phase difference when simultaneous pulses are present. The key to the invention is the manner in which a pulse is recognized as being present. Previously, a pulse was recognized if a minimum voltage threshold was exceeded by an input signal. In the present invention, a given voltage threshold must be exceeded and M out of the last N data samples must fall within a given voltage window that is above the threshold voltage.

Pulse detection is initiated by a two step process using amplitude samples. First, a dynamic noise threshold is established by using a moving average of approximately 100 amplitude samples. This establishes a dynamic threshold above the random noise level. Amplitude samples made during a pulse present condition are not used in determining the noise threshold level. When a pulse arrives, the value of the amplitude samples will start to increase. During the rise time of the pulse, the successive differences between amplitude samples will be large compared to that of successive amplitude samples on the flat portion of a pulse. When the successive differences between the amplitude samples are small enough (the size difference requirements between the successive amplitude samples will vary for different applications) then a pulse presence is declared. A determination is made whether M of the last N successive amplitude samples fall within the pre-set amplitude window as determined by the application. When this occurs it indicates the presence of a pulse and that a portion of the pulse is stable. This method allows rejection of measurements made during a period when the input signal is unstable such as during overshoot and ringing conditions.

Following detection of a stable condition, amplitude samples are continuously taken and processed to detect the end of the pulse or a pulse-on-pulse condition. A pulse-on-pulse condition is detected when the difference between successive amplitude samples again starts to increase after initially stabilizing. For instance, on the leading edge of the second pulse, the difference between successive amplitude samples will be large. As soon as M out of the last N amplitude samples fall within a predetermined voltage window then the second pulse has stabilized. On the trailing edge of the second pulse, the successive differences between amplitude samples again becomes comparatively large and fall outside of the predetermined amplitude window. Again, when M out of the last N amplitude samples fall within a predetermined range, then the second pulse has terminated. If the amplitude samples stabilize at the same level as that of the first pulse, then the samples indicate that the first pulse is still present. When the first pulse terminates, the differences between the successive amplitude samples will again become large and then stabilize at a point below the noise threshold level. With all pulses gone, the system will continue to update the noise threshold level by using the previously remembered noise threshold samples that have accumulated as well as the new noise threshold samples that will be added to an accumulator.

By using this method, the receiver can determine when the leading edge of a pulse occurs, when the pulse is stable, when an additional pulse is encountered and when the pulse terminates. The log video output of the receiver is sampled at a high rate (for example every 50 nanoseconds) that enables detection of short pulses. The amplitude signals are then converted to digital information which is processed by a digital signal processor. The invention provides a high probability that RF signals will be detected and it accomplishes that function using readily available electronic components and processing techniques.

Therefore, an object of the present invention is to provide a receiver that has a high probability of detecting signals appearing in a signal rich electronic environment. A further object of the invention is to provide an apparatus and method for analyzing RF signals to determine the existence of simultaneously received overlapping signals. Additional objects of the invention are to improve threshold accuracy by averaging multiple noise samples and to improve tolerance to distortion such as overshoot and ringing.

The foregoing objects and advantages of the invention together with the structure and characteristics thereof, briefly summarized in the foregoing passages, becomes more apparent to those skilled in the art upon reading the detailed description of the preferred embodiment taken together with the following illustrations.

DETAILED DESCRIPTION OF THE PREFERRED EMBODIMENT

Figure 1:
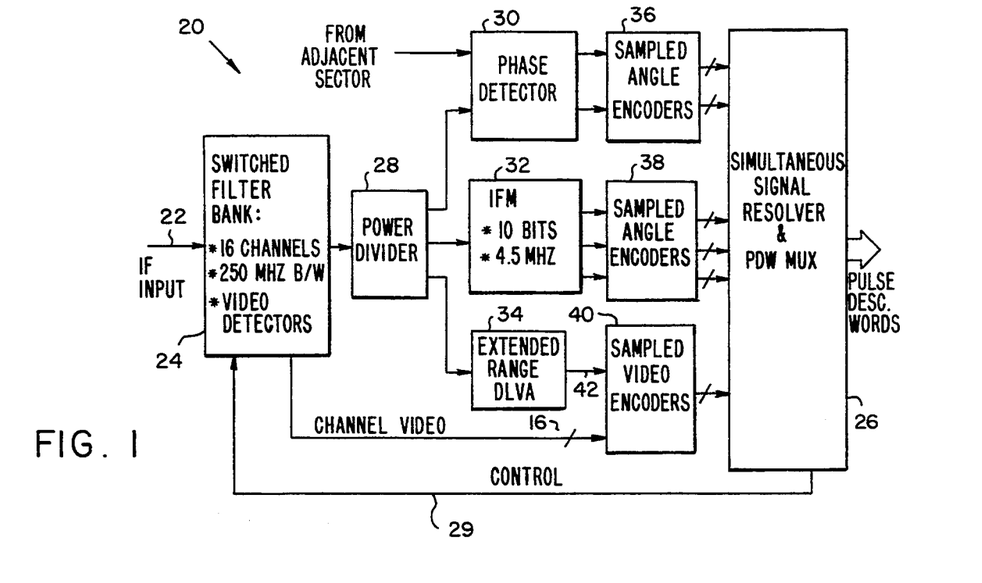
FIG. 1 is a block diagram illustrating a system for utilizing the invention.

FIG. 1 is a block diagram showing a novel arrangement of conventional circuit elements. The details of those elements are not new or necessary to an understanding of the structure of the invention or its operation. The details of the elements may be varied as desired without departing from the structure and teachings of the disclosed invention.

FIG. 1 shows a functional block diagram for the instantaneous parameter measurement receiver (IPM) 20. Multiple RF and digital techniques are employed to provide the receiver with the capabilities necessary to process simultaneously received signals. The received signal spectrum is introduced to the receiver on input line 22. That input signal is connected to a channelizing switched filter bank 24 which consists of 16 contiguous 250 MHz channels each with a dedicated crystal video detector. All 16 filter outputs are then processed in a switched summing network which allows any combination of the sixteen channels to be passed on to the rest of the receiver. This filter network provides the flexibility necessary to limit the RF signal spectrum to a level that the receiver is capable of processing. The sixteen individual narrow band (250 MHz) crystal video receivers maintain a 100% probability of signal intercept and will continue to detect and track signals over the full intermediate frequency (IF) band. The selection of the channels in the switched filter bank 24 is controlled by the processor 26. Multiple control lines 29 connect the processor 26 to the switched filter bank 24. The output of the switched filter bank 24 is connected to the input of power divider 28. Power divider 28 splits the signal of interest into three separate but identical signals that are capable of driving the inputs to a phase detector 30, a frequency detector 32 and a amplitude detector 34. The output of the phase detector 30 corresponds to the waveform illustrated in FIG. 2e. The output of the frequency detector 32 corresponds to the waveform illustrated in FIG. 2d and the output of amplitude detector 34 corresponds to the waveform illustrated in FIG. 2c. These waveforms will be discussed in greater detail below.

The output of the phase detector 30 is coupled to the input of a sampled angle encoder 36 which converts the analog output voltage of the phase detector 30 to a digital word. Similarly, the output of the frequency detector 32 is coupled to a sampled angle encoder 38 which converts the analog output voltage of the frequency detector to a digital word. Finally, the output of the amplitude detector 34 is coupled to a sampled video encoder 40 which converts the analog output voltage to a digital word. The digital outputs of the encoders 36, 38 and 40 are coupled to the simultaneous signal resolver and processor 26 that 27 that combines the digital information from each of the encoders 36, 38 and 40 to form a pulse descriptor word (PDW) which is one long digital word that will include information about the signals amplitude, phase, frequency, time of arrival and pulse width. The PDW is then sent to another digital processor (not shown) for further analysis.

The frequency detector 32 is a 10 bit instantaneous frequency measurement receiver (IFM) which measures frequency to a resolution of 4.5 MHz. The amplitude detector 34 measures amplitude over a greater than 55 dB dynamic range using an extended range log video detector and amplifier. This wide dynamic range is necessary because of the environment in which the receiver is operating. For instance, a first set of two planes may be flying close together and each plane will be emitting radar signals to detect other aircraft. A second set of aircraft may be many miles away. Consequently, the radar emissions from the two planes that are close together can be thousands to millions of times stronger to each other than the radar emissions from the second set of planes that may be many miles away. Therefore, the amplitude detector must have a wide dynamic range of greater than 55 dB.

The phase detector 30 uses a polar discriminator to measure the phase difference for applications that use interferometer Direction Finding (DF) techniques. Each of these detectors will be discussed in more detail in conjunction with the explanation of FIGS. 2a through 2e.

The system illustrated in FIG. 1 is an environment within which the invention is useful. The invention is the way in which amplitude samples are differentiated from noise in either a single signal or a pulse-on-pulse condition. The invention also makes it possible to discriminate between the various characteristics of a given signal. In the prior art, the pulse was recognized if a minimum voltage the hold was exceeded by an input signal. In the present invention, the dynamic voltage threshold must be exceeded and M out of N voltage samples must fall within a preestablished voltage window that is above the dynamic noise threshold. Multiple voltage windows are established in a situation where multiple pulses are occurring simultaneously.

Pulse detection is initialized by establishing a dynamic noise threshold using a moving average of approximately 100 amplitude samples taken during time periods when no pulses are present. This establishes a noise threshold that is constantly adjusted to compensate for changing noise levels. Amplitude samples made during a pulse present condition are not used in determining the noise threshold level. When a pulse arrives the value of the amplitude samples will begin to increase and will cross the dynamic noise threshold. During the leading edge of the pulse, the successive differences between amplitude samples will be large compared to successive differences between amplitude samples that are taken during the fiat portion of a pulse. When the successive differences between the amplitude samples are small enough, then a pulse presence is declared. The size difference requirements between the successive amplitude samples will vary for different applications. A pulse present determination is made when M out of N or, for example, two of the last three successive amplitude samples fall within the pre-set amplitude window as determined by the application. Measurements made during an unstable portion of the pulse such as overshoot or ringing can be ignored by requiring that two out of the last three pulses be within the preset voltage window.

Following detection of a stable condition, amplitude samples are continuously taken and processed to detect the end of the pulse or that another pulse is occurring simultaneously with the first pulse. The start of a pulse-on-pulse condition is detected when the absolute value of the difference between successive amplitude samples begins to increase after initially stabilizing. As an example, on the leading edge of the second pulse, the value and difference between successive amplitude samples will increase. When the second pulse stabilizes the successive amplitude samples will once again fall within a predetermined voltage window and the second pulse will be detected. It is important to note that the processor 26, FIG. 1, will remember the voltage level where the initial pulse stabilized and will also remember the voltage level at which the second pulse stabilized. At the trailing edge of the second pulse, the absolute value will fall but the differences between the successive amplitude samples will be large until the amplitude samples do one of two things. The amplitude samples will either fall below the noise threshold indicating that both the first and second pulses have terminated or the amplitude samples will stabilize at a level that is the same as the level where the first pulse initially stabilized. When the first pulse ends, the differences between the successive amplitude samples will be large and will fall below the dynamic noise threshold level. The specifics of waveform recognition will now be discussed with reference to FIGS. 2a through 2e and FIGS. 3 and 4.

Figure 2A:
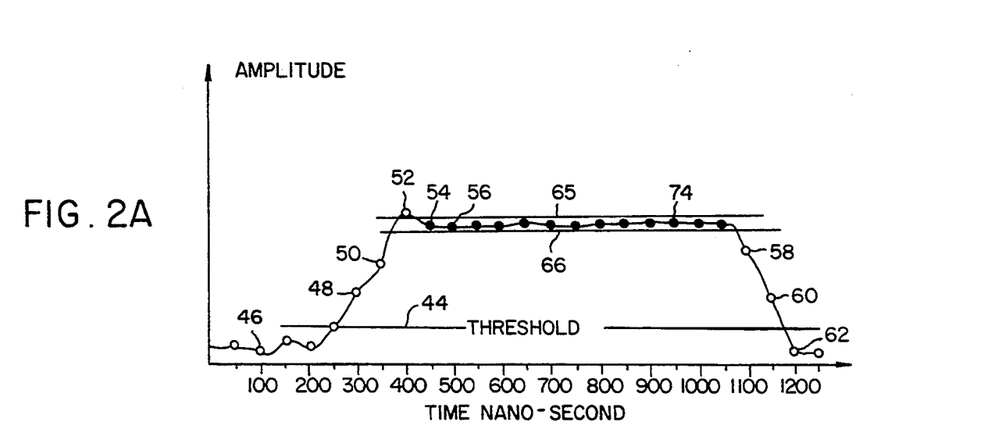
FIGS. 2a and 2b illustrate two separate waveforms that occur in the same time period and FIG. 2c illustrates the combination of the waveforms shown in FIGS. 2a and 2b.

FIG. 2a illustrates a pulse received on input line 22 that is passed through one of the 16 channels in switched filter bank 24. The pulse is passed to power divider 28 and then to the amplitude detector 34. The waveform shown in FIG. 2a represents the signal on line 42 at the output of amplitude detector 34. In this example, amplitude samples are taken every 50 nanoseconds and are indicated by either open or filled in circles in FIG. 2a. Open circles represent ignored data and filled in circles represent valid data points. The noise threshold 44 is established by a moving average of approximately 100 successive amplitude samples that are made when no pulses are present. As shown in FIG. 2a, the dynamic threshold 44 is established at a point above the noise level depending on the application. The threshold 44 is typically set for a signal-to-noise ratio (SNR) of 13 dB. The SNR is programmable so that it can accommodate varied noise conditions. Sample 46 represents one of the successive noise samples made below the threshold level 44. As the amplitude samples rise above the threshold 44, differences between successive amplitude samples are quite large as shown by the difference in amplitude between sample 48 and sample 50. Sample 52 illustrates a sample taken during an overshoot portion of the pulse. The voltage window where pulse recognition occurs is represented by lines 65 and 66. This voltage window is not recognized until amplitude sample 56 occurs. When amplitude sample 56 occurs the processor 26 recognizes that the difference between M out of N, or in this case two out of the last three, samples, (52, 54 and 56) is within the predetermined acceptable limit (in this case 100 mV) represented by the difference between lines 65 and 66. The processor 26 then remembers that the predetermined voltage window has been established at the amplitude represented by pulses samples 54 and 56.

The size of the voltage window for amplitude samples is generally set to produce an SNR of between 10 and 13 dB which will generally achieve an acceptable balance between proabability of intercept and false alarm. The upper and lower limits of the amplitude window represented by lines 65 and 66 can be established in any number of ways. For instance, if the window is 100 mV wide and the first voltage sample is at 950 mV and the second voltage sample is at 980 mV then the 100 mV window is established between 950 mV and 1050 mV. If, on the other hand the first voltage sample in the series is at 1,000 mV and the second voltage sample is at 975 mV then the window is established between 1,000 mV and 900 mV. In this method, if the second voltage sample is within 100 mV of the first voltage sample and is above the first voltage sample then the amplitude window is established between the first voltage sample and a point 100 mV above the first voltage sample. If, the second voltage sample is within 100 mV of the first and it is below the first voltage sample then the amplitude window is established between the first voltage sample and a point 100 mV below the first voltage sample. This method sets the limits of the voltage window at points that account for either a slightly rising voltage trend or a slightly falling voltage trend. Once the voltage window is established, a pulse presence is declared and the system remembers where the voltage window has been established and starts to look for indications that there is a pulse-on-pulse situation or that the pulse is terminating.

The amplitude samples remain within the voltage window until sample 58 occurs outside of the voltage window. Again the successive differences between voltage samples is shown by the difference between voltage samples 58 and 60. When voltage sample 62 occurs, the processor 26 knows that the voltage samples have fallen below the dynamic noise threshold 44 and that the pulse has terminated. Using this technique, the processor 26 can determine the carrier frequency, pulse width (PW), time of arrival (TOA) and amplitude (AMP). FIG. 2a shows only one pulse without its carrier frequency in what would be a series of pulses that would be identical to that shown in FIG. 2a. The pulse repetition interval "PRI" of that pulse train would be determined when the second pulse in the series occurs and stabilizes in the same manner as the pulse shown in FIG. 2a.

Figure 2B:
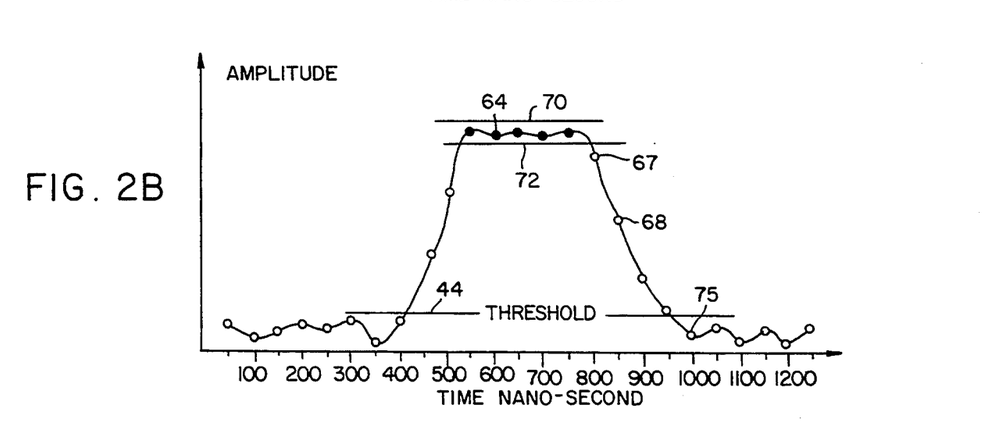

In a pulse-on-pulse condition, a second pulse from a second emitter is received during the same time period as that of the first pulse. FIG. 2b represents a second pulse of higher amplitude that could occur during the time period of the first pulse shown in FIG. 2a. If two such pulses are received then the resulting output on line 42 of amplitude detector 34 would be as shown in FIG. 2c.

With reference to FIG. 2b, when amplitude sample 64 occurs, the processor 26 knows that the difference between two out of the last three pulses has occurred within a predetermined voltage window represented by lines 70 and 72. The amplitude samples remain within that window until amplitude sample 67 occurs. Again, the difference between the successive amplitude samples 67 and 68 is large and the processor would recognize this portion of the waveform as the trailing edge. The processor 26 would recognize that the pulse in FIG. 2b had terminated when amplitude sample 75 occurs.

Figure 2C:
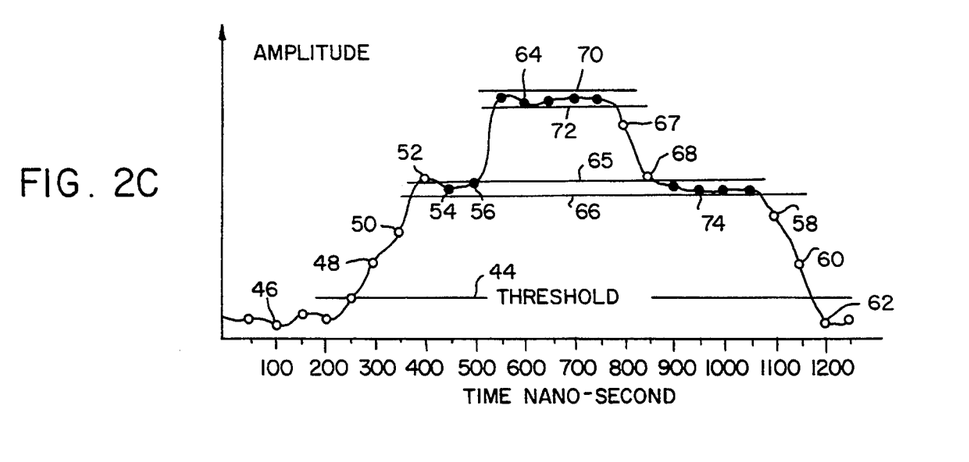

If the waveforms in FIGS. 2a and 2b occur at the same time, then the waveform in FIG. 2c results on the output line 42 of the amplitude detector 34. In this instance, the amplitude samples 46 through 56 occur in an identical manner as shown in FIG. 2a. This establishes the initial pulse presence and the voltage window designated by lines 65 and 66. However, when voltage sample 64 occurs, two out of the last three samples have fallen within a new predetermined voltage window as illustrated by lines 70 and 72.

When amplitude sample 67 occurs, it falls outside of the voltage window illustrated by lines 70 and 72 and the processor 26 recognizes that the second pulse is on its trailing edge. When voltage sample 74 occurs, the processor 26 knows that the first pulse is still present because two out of the last three amplitude samples occur within the voltage window illustrated by lines 65 and 66. The processor also knows that this is the same amplitude level that was determined when the first pulse was initially detected. Amplitude samples 58 through 62 are the same as in FIG. 2a and indicate to processor 26 that the first pulse has now terminated. This technique allows the processor 26 to determine the pulse width, time of arrival, carrier frequency and amplitude for both the first and second pulses. When those pulses reoccur the PRI for both pulses can be determined.

Figure 2D:
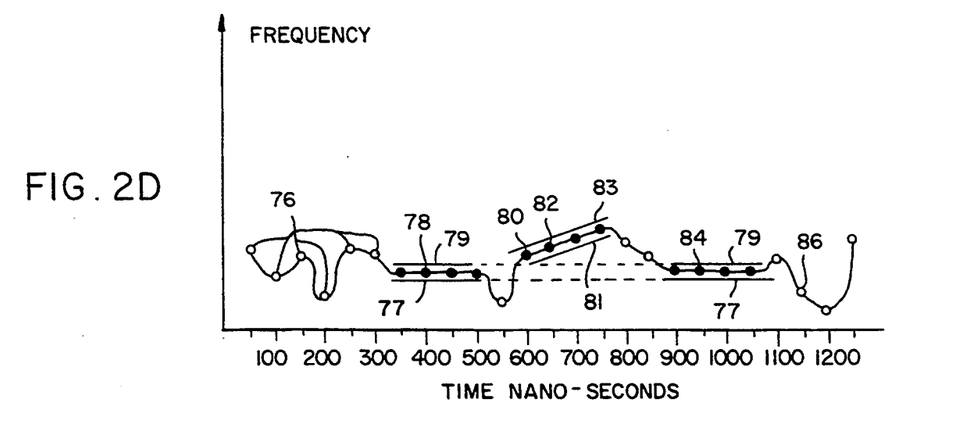
FIG. 2d is a frequency plot of a waveform and FIG. 2e is a phase plot of a waveform.

FIG. 2d represents the output of the frequency detector 32. The frequency detector 32 transforms the carrier frequency to a voltage level. When samples are not within a stability window then the carrier frequency measurements represented by the open circles are disregarded as indicated by samples 76. The filled in circles 78, 80, 82 and 84 indicate that valid carrier frequency measurements have been made. Sample 78 is in a group of four samples in which the radar carrier frequency is stable within a predetermined window as indicated by lines 77 and 79. Samples 80 and 82 are in a group of four samples that show that the carrier frequency of the second pulse is increasing in a linear fashion with a slope represented by lines 81 and 83. Unlike the output of the amplitude detector 34, the output of the frequency detector may trigger the establishment of a voltage window with a slope as indicated by lines 81 and 83. A rising slope shown by lines 81 and 83 indicates that the radar signals shown in 2b has a carrier frequency that is increasing over the course of the pulse envelope shown in FIG. 2b. The carrier frequencies for the pulse envelopes shown in FIGS. 2a, 2b and 2c are not shown. The sample criteria for recognizing a stable or increasing frequency is that M out of the last N samples must fall within a predetermined voltage window and, in the case of frequency, the voltage window can have a slope. The upper and lower limits of the voltage window for frequency measurement are keyed off the last measurement taken. For instance, if the voltage window is set at 100 mV and the first sample is at 1,000 mV then a potential window would be established between 1,000 mV and 1,100 mV. If the next sample is 1,050 mV then a new voltage window, this time with a slope, is established between 1,050 mV and 1,150 mV. At this point, the processor recognizes that M out of the last N or two out of the last three samples have occurred within the predetermined voltage window and that the frequency measurements are valid. If the next sample occurs at 1,100 mV then that sample is within the sloping voltage window and a new voltage window is established between 1,100 and 1,200 mV. The processor then recognizes valid frequency information until two out of the last three voltage samples do not fall within the sloping voltage window.

When the second pulse terminates, the frequency samples return to the initial level represented by sample 84 which is one sample in a group of four that fall within the predetermined window represented by lines 77 and 79. Frequency differences are continuously sampled and processed. Stable measurements are indicative of a single stable emitter. Changes between successive samples are processed to extract either linear or discrete stair-step values of carrier frequency modulation on a pulse. Thus, when sample 78 occurs, the processor 26 knows that there is a constant carrier frequency because M out of N or in this case two out of the last three frequency samples fall within a predetermined voltage window indicated by lines 77 and 79. As the trailing edge of the pulse envelope occurs, the frequency measurements are disregarded as indicated by open circle 86.

Figure 2E:
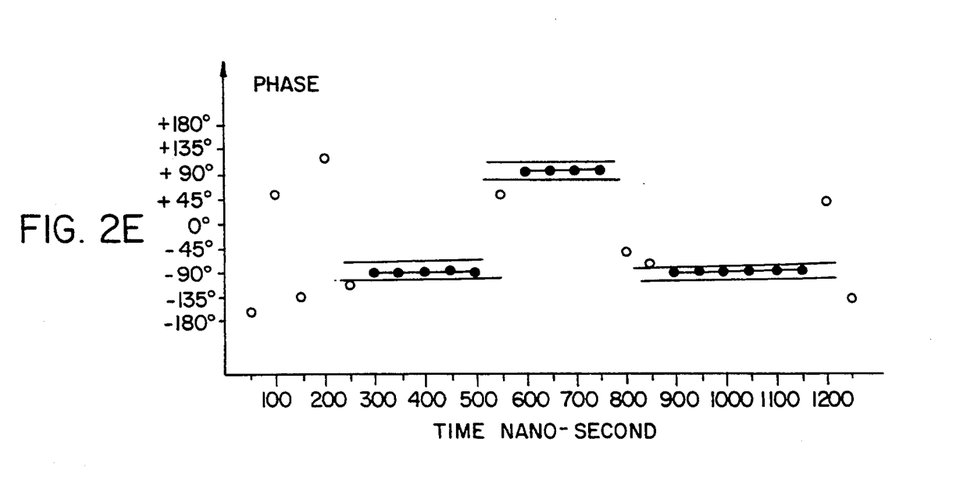
Figure 3:
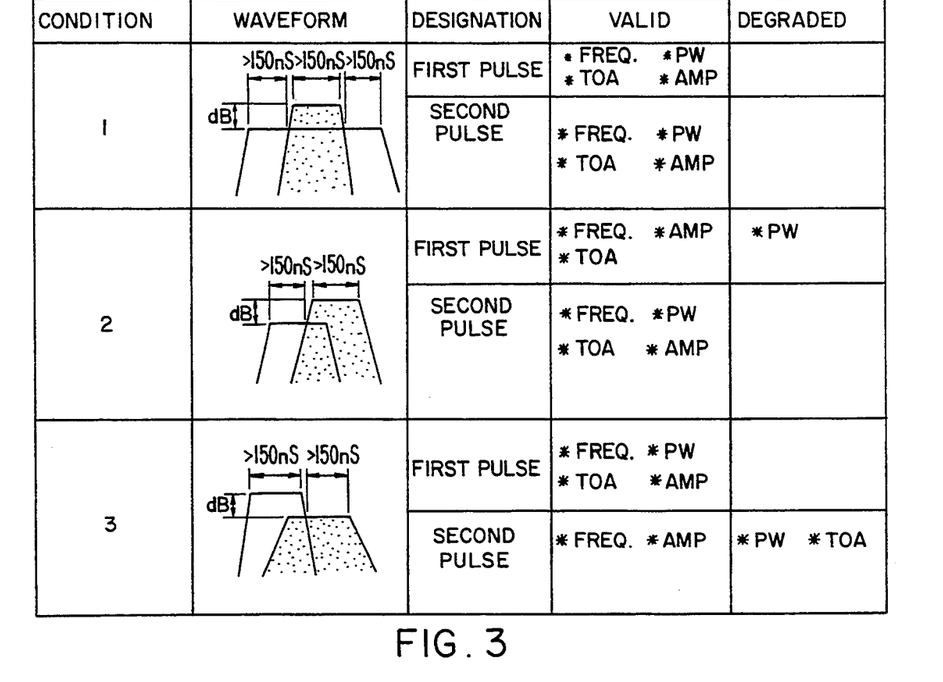
FIG. 3 is laboratory data illustrating the ability to discriminate three pulse-on-pulse conditions.
Figure 4:
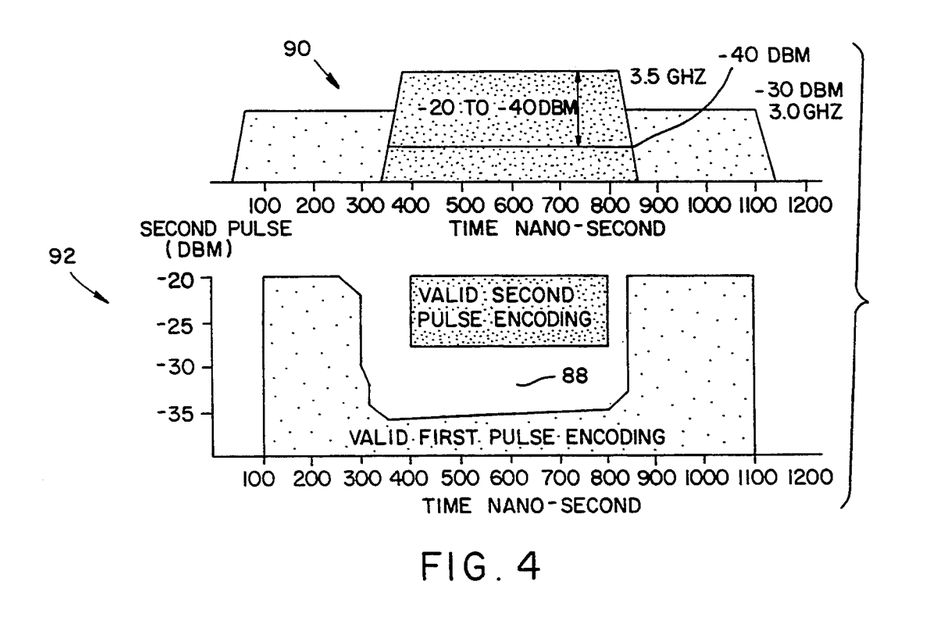
FIG. 4 is laboratory data illustrating the probability that pulses will be detected at various relative amplitude levels.

FIG. 2e illustrates the output of the phase detector 30 shown in FIG. 1. The phase detector 30 converts phase information to a voltage level. When there is no pulse or a particular pulse is not stable, then the phase information is unstable and therefore ignored as indicated by the open circles in FIG. 2e. When a pulse is stabilized then the phase information at the output of phase detector 30 is valid as indicated by the dark circles that are connected. Again, when M out of N or in this case two out of the last three voltage samples fall within a predetermined range, then the phase measurements are valid and are encoded into the PDW. With phase measurements, the phase relationship of the pulses should remain stable during valid measurements. Therefore, once the phase measurement criteria have been met, namely two out of the last three phase measurements have fallen within a predetermined voltage window, the voltage window is fixed at that level and the processor will not recognize a slope in the voltage window for the phase measurement and any pulses occurring outside of that window will be disregarded. The upper and lower limits of the voltage window for phase measurement are established in the same manner used to establish the upper and lower limits of the voltage window for amplitude measurement. The size of the voltage window for both phase and frequency measurements is generally set at a level that produces an acceptable accuracy. Generally, windows corresponding to SNR's of 3 to 6 dB produce acceptable measurements. However, when using the N out of M method of processing signals, it is possible to use a lower SNR because of the processing gain achieved by using that method as opposed to a single sample method. To validate this method, testing was done in the laboratory to determine if a pulse-on-pulse condition could be detected under various conditions. FIGS. 3 and 4 show the results of this testing.

FIG. 3 shows three pulse-on-pulse conditions and indicates for each case typical conditions over which the parameter measurements will be valid or corrupted. As long as the second pulse is greater in amplitude than the first by a sufficient margin, the encoding process can measure the second pulse. Margins will range from 3 to 6 dB depending on specific system parameters. If the amplitude of the second pulse does not exceed the first pulse by the detection margin, the second pulse will not be detected and it will not corrupt the first pulse. In essence, as long as the amplitude of the first emitter exceeds that of all other emitters by the detection margin for at least 150 nanoseconds (three samples) it can be accurately detected and encoded. Pulses less than 150 nanoseconds are detected using an algorithm designed to work with only two samples. The 150 nanosecond sample rate can be higher or lower depending on the characteristics of the signal that the receiver is looking for.

The procedure of using two out of the last three samples that fall within a predetermined voltage window has worked well by increasing the probability of successfully processing pulse-on-pulse conditions. However, other combinations such as using three out of the last four or five out of the last nine may be useful when other conditions are present.

With reference to the table shown in FIG. 3, pulse condition 1 shows two waveforms in which the second waveform is sufficiently greater (within the detection margin) in amplitude than the first pulse. The first pulse is non-shaded and the second pulse is shown in shade. As shown by the table, the frequency, pulse width, time of arrival and amplitude of both the first and second pulses can be validly measured. In the second pulse condition, the pulse width of the first pulse cannot be accurately measured and is degraded because the first pulse terminates while the second pulse is still present. However, the frequency, amplitude and time of arrival of the first pulse are validly measured and the frequency, pulse width, time of arrival and amplitude of the second pulse can be validly measured. In the third condition, the frequency, pulse width, time of arrival and amplitude of the first pulse can be accurately measured. The pulse width and time of arrival measurements for the second pulse are degraded because the leading edge of the second pulse occurs during the presence of the first pulse. However, the frequency and amplitude of the second pulse can be accurately measured.

FIG. 4 represents laboratory data in which a series of tests were conducted to demonstrate the system's ability to detect a pulse-on-pulse condition. The variable input conditions to the receiver are shown in diagram 90 in which two pulses were generated. The first emitter was a one microsecond wide pulse at 3.0 GHz with an amplitude fixed at −30 dBm. The second emitter was a 500 nanosecond wide pulse at 3.5 GHz, centered within the first pulse. The amplitude of the second pulse was then varied over a 10 dB amplitude range above and below the first pulse. At each amplitude, data was recorded during the one microsecond period that the two signals existed. The results of the tests are shown in Graph 92 of FIG. 4. Within the first and last 200 nanosecond regions, the first signal was always correctly encoded. Within the overlap region, the results depended on the amplitude difference between the two signals. When the second signal was less than the first by at least 6 dB it was neither detected nor did it corrupt the first signal. When the second pulse exceeded the first by at least 3 dB it was successfully encoded. Invalid encoding occurred in the remaining region shown by white space 88. This test demonstrated that the technique will resolve two time overlapped pulses.

In those instances where a single high power or long pulse width emitter effectively blocks out all other emitters, the switched filter bank 24 of FIG. 1 is used to reject that emitter. During these periods, the crystal video detector in the switched filter bank 24 dedicated to that filter channel is used to monitor signal activity in the channel. The filter band is periodically monitored and reconnected when a dedicated detector indicates that the interfering signal has dropped below the noise threshold.

This signal detection system offers a significant breakthrough for receiver designs that require a high probability of intercepting simultaneous signals.

It is believed that the foregoing description of the preferred embodiment of the invention is sufficient in detail to enable one skilled in the art to make and use the invention. However, it is expressly understood that the details of the elements which are presented for the foregoing enabling purpose is not intended to limit the scope of the invention, in as much as equivalents to those elements and other modifications thereof, all of which come within the scope of the invention, become apparent to those skilled in the art upon reading this specification. Thus the invention is to be broadly construed within the full scope of the appended claims.

What is claimed is:

1. An instantaneous parameter measurement receiver, comprising:

means for receiving RF signals having a carrier frequency, threshold means for establishing a threshold voltage level that is above a random noise level;

processor means for processing said RF signals, said processor means including:

means for successively sampling the amplitude of said RF signals above said threshold voltage level;

means for storing the value of the successive amplitude samples;

means for comparing said successive amplitude samples and determining the difference between said successive amplitude samples;

means for establishing and storing a first amplitude window;

means for comparing the difference between said successive amplitude samples to determine if successive amplitude samples fall within said first amplitude window; and said processor means determining when a pulse is present, when a pulse is stable and when a pulse is terminated by identifying when M out of N successive amplitude samples have stabilized within said first amplitude window.

2. An instantaneous parameter measurement receiver as in claim 1 including:

means for establishing and remembering a second amplitude window in addition to said first amplitude window for identifying successive amplitude samples that occur outside the first amplitude window, within said second amplitude window and above said threshold voltage level for determining the existence of a pulse-on-pulse condition.

3. An instantaneous parameter measurement receiver in claim 2 including:

means for comparing successive amplitude samples in a third amplitude window occurring after the successive amplitude samples in said first amplitude window and occurring outside said second amplitude window to the amplitude samples occurring in said first amplitude window to determine if the value of the third amplitude is the same as the value of the first amplitude window.

4. The instantaneous parameter measurement receiver of claim 1 wherein:

said threshold voltage level is established by a moving average of amplitude samples taken during time periods when no pulses are present.

5. An instantaneous parameter measurement receiver of claim 2 including:

means to measure the carrier frequency, means to convert the value of said carrier frequency into a voltage level, means for converting said voltage level into a digital word, said processor means continuously sampling the value of said voltage level corresponding to the carrier frequency, said processor means having a third voltage window, said processor means comparing the difference between successive voltage samples corresponding to said carrier frequency to said third voltage window to determine if M of N voltage samples are within said third window and thereby determine if the frequency of said carrier signal is stable, unstable, increasing or decreasing.

6. The instantaneous parameter measurement receiver of claim 5 including:

means to detect the angle of arrival of an RF signal through differential phase measurements taken between antennas;

means for converting said phase measurements into an analog voltage level, means for converting said voltage level to a digital word;

said processor means successively sampling the amplitude of said voltage level corresponding to said phase measurements, said processor having a fourth voltage window, said processor comparing the successive voltage samples corresponding to said phase measurements to said fourth voltage window to determine if M out of N samples are within said fourth voltage window and thereby determine if the phase of said RF signal is stable or unstable.

7. The instantaneous parameter measurement receiver of claim 3 including:

switched filter means associated with said receiver, said filter means having control input, whereby the function of said filter means is controllable by said processor means to determine which signals are passed to said means for sampling the log amplitude of said RF signal.

8. A method of detecting and measuring in real time the characteristics of received RF signals, said method comprising:

establishing a threshold voltage using amplitude samples taken when no pulses are present;

sampling the log amplitude of said received signals;

establishing a voltage window; and determining when a pulse is present by comparing the difference between successive amplitude samples to said voltage window and determining if M of N successive amplitude samples fall above said threshold voltage and fall within said voltage window.

9. The method of claim 8 including the steps of detecting a second pulse occurring during the time period of said RF signal by establishing a second amplitude window and continuously monitoring the value of successive amplitude samples to determine if successive amplitude samples fall within said second amplitude window which is above said threshold voltage and which is different in value than said first amplitude window.

10. An instantaneous parameter measurement receiver, comprising:

means for receiving RF signals having a carrier frequency, threshold means for establishing a threshold voltage level that is above a random noise level;

processor means for processing said RF signals, said processor means including;

means for converting the value of said carrier frequency into a voltage level;

means for storing the value of the successive voltage samples;

means for comparing successive voltage samples and determining the difference between said successive voltage samples;

means for establishing and storing a first voltage window;

means for comparing the difference between said successive voltage samples to determine if the successive voltage samples fall within said first voltage window, said processor means determining when a carrier frequency is stable by identifying when M out of N successive voltage samples have stabilized within said first voltage window.

11. An instantaneous parameter measurement receiver as in claim 10 including:
means for establishing and remembering a second voltage window in addition to said first voltage window for identifying successive voltage samples that occur outside the first voltage window, within said second voltage window and above said threshold voltage level for determining the existence of an increasing or decreasing carrier frequency.

12. The instantaneous parameter measurement receiver of claim 11 wherein:
said threshold voltage level is established by a moving average of amplitude samples taken during time periods when no pulses are present.

13. An instantaneous parameter measurement receiver, comprising:
means for receiving RF signals having a carrier frequency,
threshold means for establishing a threshold voltage level that is above a random noise level;
processor means for processing said RF signals, said processor means including:
means for detecting the angle of arrival of an RF signal through differential phase measurements taken between antennas;
means for converting said phase measurements into an analog voltage level;
means for storing the value of the successive voltage samples;
means for comparing successive voltage samples of said voltage level and determining the difference between said successive voltage samples;
means for establishing and storing a first voltage window;
means for comparing the difference between said successive voltage samples to determine if successive voltage samples fall within said first voltage window, said processor means determining when a phase angle is stable by identifying when M out of N successive voltage samples have stabilized within said first voltage window.

14. An instantaneous parameter measurement receiver as in claim 13 including:
means for establishing and remembering a second voltage window in addition to said first voltage window for identifying successive voltage samples that occur outside the first voltage window, within said second voltage window and above said threshold voltage level for determining the existence of a change in phase angle.

15. The instantaneous parameter measurement receiver of claim 14 wherein:
said threshold voltage level is established by a moving average of amplitude samples taken during time periods when no pulses are present.

* * * * *